(12) United States Patent
Wang et al.

(10) Patent No.: US 11,668,756 B2
(45) Date of Patent: Jun. 6, 2023

(54) BATTERY DEGRADATION MONITORING SYSTEM AND METHODS

(71) Applicant: Google LLC, Mountain View, CA (US)

(72) Inventors: David Wang, San Jose, CA (US); Lauren Francine Chanen, San Francisco, CA (US); James Robert Lim, Mountain View, CA (US); Pak Heng Lau, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 145 days.

(21) Appl. No.: 17/032,668

(22) Filed: Sep. 25, 2020

(65) Prior Publication Data

US 2022/0099749 A1    Mar. 31, 2022

(51) Int. Cl.
| | | |
|---|---|---|
| *G01R 31/392* | (2019.01) | |
| *G01L 9/00* | (2006.01) | |
| *H01M 10/48* | (2006.01) | |
| *G01R 31/389* | (2019.01) | |
| *G01R 31/36* | (2020.01) | |

(52) U.S. Cl.
CPC .......... *G01R 31/392* (2019.01); *G01L 9/0002* (2013.01); *G01R 31/3644* (2013.01); *G01R 31/389* (2019.01); *H01M 10/48* (2013.01)

(58) Field of Classification Search
CPC .............. G01R 31/392; G01R 31/389; G01R 31/3644; G01L 9/0002; H01M 10/48
USPC .............................................. 324/425; 429/90
See application file for complete search history.

(56) References Cited

U.S. PATENT DOCUMENTS

| | | | |
|---|---|---|---|
| 8,168,317 | B2 | 5/2012 | Yoon et al. |
| 8,896,271 | B2 | 11/2014 | Kim et al. |
| 9,768,429 | B2 | 9/2017 | Chung et al. |
| 10,044,080 | B2 | 8/2018 | Kim et al. |
| 10,347,877 | B2 | 7/2019 | Douke et al. |
| 2002/0160245 | A1 | 10/2002 | Genc |

(Continued)

FOREIGN PATENT DOCUMENTS

| | | |
|---|---|---|
| CN | 204760501 U | 11/2015 |
| CN | 105807230 B | 3/2016 |

(Continued)

OTHER PUBLICATIONS

Tessier et al., "Real-Time Estimator Li-ion Cells Internal Resistance for Electric Vehicle Application," Jun. 2016.
"Non-Final Office Action", U.S. Appl. No. 17/032,679, dated Oct. 27, 2022, 7 pages.
"Restriction Requirement", U.S. Appl. No. 17/032,679, dated Aug. 26, 2022, 6 pages.

(Continued)

*Primary Examiner* — Lee E Rodak
*Assistant Examiner* — Trung Q Nguyen
(74) *Attorney, Agent, or Firm* — Colby Nipper PLLC (57) ABSTRACT

A method for monitoring battery degradation including receiving, from a pressure sensor, a first pressure value associated with a battery pack, comparing the first pressure reading to a first pressure threshold value and if the first pressure reading is greater than the first pressure threshold value, applying a first battery discharge pulse to the battery pack. The method further includes calculating a first internal resistance value of the battery pack in response to the first battery discharge pulse, comparing the first internal resistance value to an initial internal resistance value, and transmitting an alert to an electronic device if the first internal resistance value exceeds the initial internal resistance value.

20 Claims, 7 Drawing Sheets

(56) References Cited

U.S. PATENT DOCUMENTS

| | | | |
|---|---|---|---|
| 2006/0292436 A1 | 12/2006 | Cook et al. | |
| 2011/0210703 A1 | 9/2011 | Souza et al. | |
| 2014/0269811 A1 | 9/2014 | Maleki et al. | |
| 2016/0322676 A1* | 11/2016 | Jun | H01M 10/4257 |
| 2016/0336562 A1 | 11/2016 | Oh et al. | |
| 2019/0319466 A1 | 10/2019 | Pk | |
| 2020/0313152 A1* | 10/2020 | Stefanopoulou | B60L 58/12 |
| 2022/0099606 A1 | 3/2022 | Wang et al. | |
| 2022/0102691 A1 | 3/2022 | Wang et al. | |

FOREIGN PATENT DOCUMENTS

| | | |
|---|---|---|
| CN | 110612620 | 12/2019 |
| CN | 111624502 | 9/2020 |
| JP | 2016177941 A | 10/2016 |
| KR | 101926341 | 3/2019 |
| KR | 20220081583 | 6/2022 |
| WO | 2014156869 | 10/2014 |

OTHER PUBLICATIONS

"Non-Final Office Action", U.S. Appl. No. 17/032,685, filed Mar. 14, 2023, 18 pages.

"Notice of Allowance", U.S. Appl. No. 17/032,679, filed Feb. 15, 2023, 9 pages.

Zhang, et al., "A Fully Integrated Battery-Powered System-on-Chip in 40-nm CMOS for Closed-Loop Control of Insect-Scale Pico Aerial Vehicle", Sep. 2017, pp. 2374-2386.

\* cited by examiner

| Battery Temp (degC) | Internal Resistance Scaling Factor |
|---|---|
| -20 | 8x |
| -10 | 4x |
| 0 | 2x |
| 10 | 1.5x |
| ≥ 20 | 1x |

BATTERY DEGRADATION MONITORING SYSTEM AND METHODS

CROSS REFERENCE TO RELATED APPLICATIONS

This application is related to U.S. patent application Ser. No. 17/032,685, filed Sep. 25, 2020, entitled "Battery Expansion Control System," and U.S. patent application Ser. No. 17/032,679, filed Sep. 25, 2020, entitled "Thermal Gradient Battery Monitoring System and Methods," each of which is hereby incorporated by reference in its entirety.

TECHNICAL FIELD

The present invention relates to a battery degradation monitoring system and methods thereof for use in a battery pack.

BACKGROUND

Battery powered electronic devices are sometimes exposed to high temperatures causing excessive battery heating and accelerated battery swell from electrolyte decomposition and gas generation. As the battery swells, the internal pressure of the cells of the battery continues to increase until the electrolyte is consumed and the battery reaches peak thickness, or a seal of a pouch holding the battery breaks open to allow the internal gas to vent and the electrolyte to leak. In some instances, if the cell pouch seal is able to withstand high pressure, as is typical for cells designed for longevity, the battery enclosure may break open to accommodate the battery expansion.

In traditional systems, a fuel gauge is typically used for monitoring the health of the battery. The fuel gauge accumulates battery capacity during charge and discharge and compares it with a reference design capacity. Decreasing battery capacity may be caused by battery degradation and may be associated with battery swell. However, in some systems, the battery is only discharged for short pulses during use resulting in the battery being mainly held at full charge, and thus rarely fully discharged. In such systems, a fuel gauge may not be able to effectively track and monitor the battery capacity degradation, and health.

BRIEF SUMMARY OF THE INVENTION

Implementations of the present invention are directed to a method for monitoring battery degradation, the method including receiving, from a pressure sensor, a first pressure value associated with a battery pack, comparing the first pressure reading to a first pressure threshold value and if the first pressure reading is greater than the first pressure threshold value, applying a first battery discharge pulse to the battery pack, calculating a first internal resistance value of the battery pack in response to the first battery discharge pulse, comparing the first internal resistance value to an initial internal resistance value, and if the first internal resistance value exceeds the initial internal resistance value, transmitting an alert to an electronic device.

In some implementations, the method further includes receiving, from the pressure sensor, a second pressure value associated with the battery pack, comparing the second pressure reading to a second pressure threshold value and if the second pressure reading is greater than the second pressure threshold value, applying a second battery discharge pulse to the battery pack, calculating a second internal resistance value of the battery pack in response to the second battery discharge pulse, comparing the second internal resistance value to the first internal resistance value, and if the second internal resistance value exceeds the first internal resistance value, transmitting a function request to the battery pack.

In some implementations, the method further includes comparing the second internal resistance value to a threshold internal resistance value and disabling an electronic device associated with the battery pack if the second internal resistance value exceeds the threshold internal resistance value. The method may also include transmitting an alert if the second internal resistance value exceeds the first internal resistance value. In some implementations, the function request includes a disable request.

In some implementations, the method further includes storing the first pressure value, the second pressure value, the first internal resistance value, and the second internal resistance value within a memory.

In some implementations, the method further includes scaling the first internal resistance value and the second internal resistance value based on a temperature detected by the battery pack.

In some implementations, the method further includes comparing the second internal resistance value to the first internal resistance value to determine a second internal resistance increase value and determining a second swell increase value associated with the battery pack based on the second internal resistance increase value.

In some implementations, the pressure sensor is disposed proximate the battery pack. The first pressure value may be received periodically In some implementations, the battery pack is configured to be disposed within an enclosure.

In some implementations, the method further includes comparing the first internal resistance value to the initial internal resistance value to determine a first internal resistance increase value, and determining a first swell increase value associated with the battery pack based on the first internal resistance increase value.

Another implementation of the present invention is directed to an electronic device including a battery pack, a pressure sensor disposed proximate to the battery pack, a battery degradation module communicatively coupled to the battery pack and the pressure sensor, the battery degradation module configured to receive, from the pressure sensor, a first pressure value associated with the battery, determine that the first pressure value is above a first pressure threshold value and apply a first battery discharge pulse to the battery pack, calculate a first internal resistance value of the battery in response to the first battery discharge pulse, determine if the first internal resistance value exceeds an initial internal resistance value, and if the first internal resistance value exceeds the initial internal resistance value, transmit an alert to an electronic device.

In some implementations, the battery degradation module is further configured to receive, from the pressure sensor, a second pressure value associated with the battery pack, determine that the second pressure value is above a second pressure threshold value and applying a second battery discharge pulse to the battery pack, calculate a second internal resistance value of the battery pack in response to the second battery discharge pulse, determine if the second internal resistance value exceeds the first internal resistance value, and if the second internal resistance value exceeds the first internal resistance value, transmit a function request to the battery pack.

In some implementations, the battery degradation module is further configured to scale the first internal resistance value and the second internal resistance value based on a temperature detected by the battery pack. The battery degradation module may be further configured to determine that the first pressure value is above a third pressure threshold value and if the first pressure value is above the third pressure threshold value, transmit a disable request to the battery pack. In some implementations, the function request includes a disable request.

In some implementations, the battery degradation module is disposed within the enclosure. In some implementations, the first pressure value is received periodically.

BRIEF DESCRIPTION OF THE DRAWINGS

For a better understanding of the various implementations described and shown herein, reference should be made to the Detailed Description of implementations below, in conjunction with the following drawings in which like reference numerals refer to corresponding parts throughout the figures.

DETAILED DESCRIPTION OF THE EXEMPLARY IMPLEMENTATIONS OF THE INVENTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Referring to the drawings in detail, wherein like reference numerals indicate like elements throughout, there is shown in FIGS. 1-7 a battery monitoring system 100, which may include a battery stored within an enclosure of an electronic device. In some implementations, battery monitoring system 100 may be contained within a battery housing such that battery monitoring system 100 is entirely contained within the battery housing. In some implementations, the battery housing containing battery monitoring system 100 is placed into an electronic device and the battery housing is configured to be used with the electronic device and/or retrofitted to be used with an electronic device.

Figure 1:
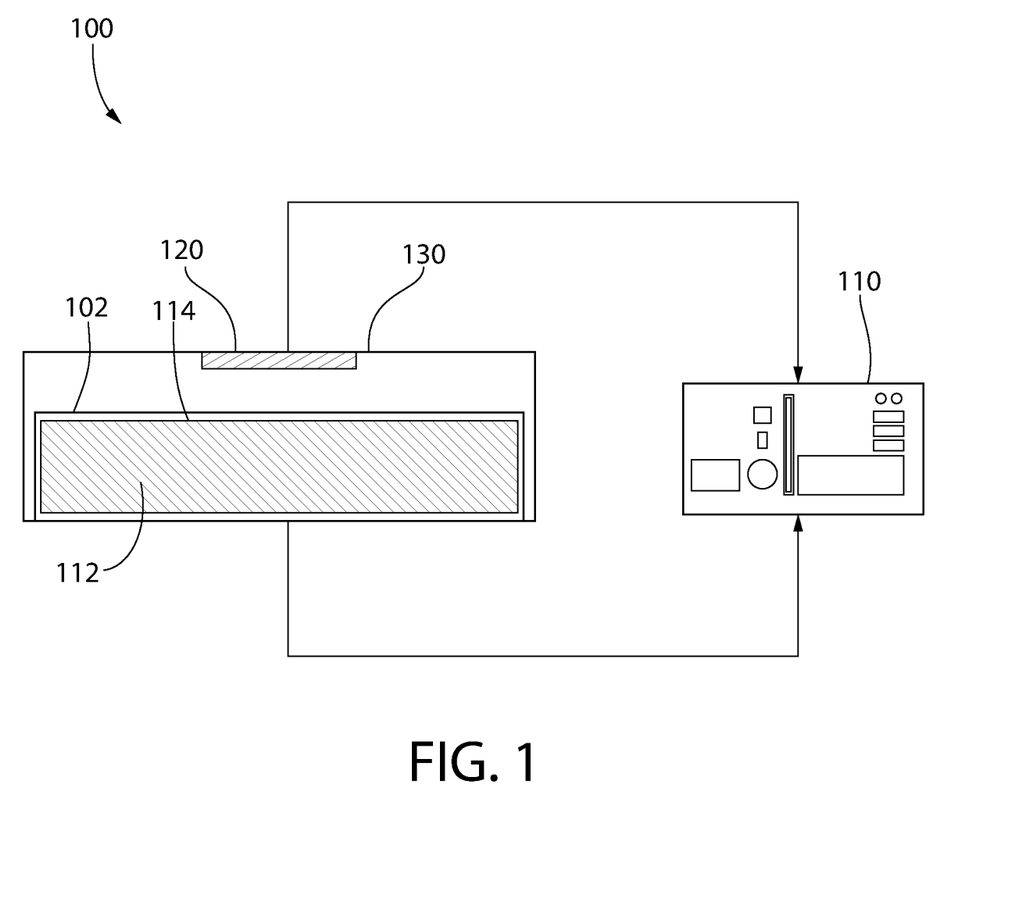
FIG. 1 is an illustration of a battery monitoring system in accordance with some implementations of the present invention.

Referring to FIG. 1, in some implementations, battery 112 is stored in battery pack 102. Battery pack 102, e.g. a cell pouch, may be a pouch comprised of a plurality of layers and may be configured to create an airtight seal around battery 112. Battery pack 102 may be similar to a standard rechargeable battery and may include battery 112. Battery pack 102 may be fixed within or to a device or removable from the device. In some implementations, battery pack 102 is a non-removable battery. Battery 112 may be disposed within battery pack 102 and may be comprised of a jelly-roll structure. Battery 112, e.g. the jelly-roll structure, may be comprised of anode and cathode sheets, each separated by a separator. For example, the jelly roll structure may be comprised of an anode-separator—cathode configuration, which is rolled and inserted into the cell pouch. In some implementations, electrolyte is injected into the pouch. The electrolyte serves as a conductive means for ions to move from the cathode to anode when battery 112 is charging, and move from the anode to the cathode when battery 112 is discharging.

Battery 112 may degrade over time resulting in battery pack 102 swelling and expanding. For example, over time the electrolyte within battery 112 may degrade releasing gases such as carbon dioxide or carbon monoxide. The gas generated by battery 112 within battery pack 102 may cause battery pack 102 to swell and expand due to battery pack 102 creating an airtight seal around battery 112. In some implementations, without intervention, battery pack 102 may swell and expand causing the airtight seal to burst, which may cause the contents of the battery pack 102 to leak out. Further, swelling and expansion of battery pack 102 may cause damage to enclosure 130 or the surrounding areas.

In some implementations, battery monitoring system 100 includes battery pack 102, pressure sensor 120, and control board 110. Battery pack 102 and pressure sensor 120 may be coupled to control board 110. For example, battery pack 102 and pressure sensor 120 may be communicatively coupled to control board 110 to provide information to control board 110. In some implementations, battery pack 102 is disposed within enclosure 130, which may be an enclosure of an electronic device. In some implementations, battery pack 102 is disposed within an electronic device configured for outdoor use. For example, battery pack 102 may be disposed within an outdoor doorbell, outdoor security camera, outdoor motion sensor, outdoor smart device, automobile devices, or any other electronic device. However, battery pack 102 may be disposed within an electronic device configured for indoor use. For example, battery pack 102 may be used inside of a warehouse with devices and systems that are warm. In some implementations, battery pack 102 is configured to be discharged for short pulses. For example, battery pack 102 may be stored within an electronic device of an outdoor doorbell and may only discharge for short pulses during events such as doorbell rings and motion detection. Battery pack 102 may be charged back up to full capacity by, for example, trickle charging to allow battery pack 102 to remain at full charge.

Figure 2:
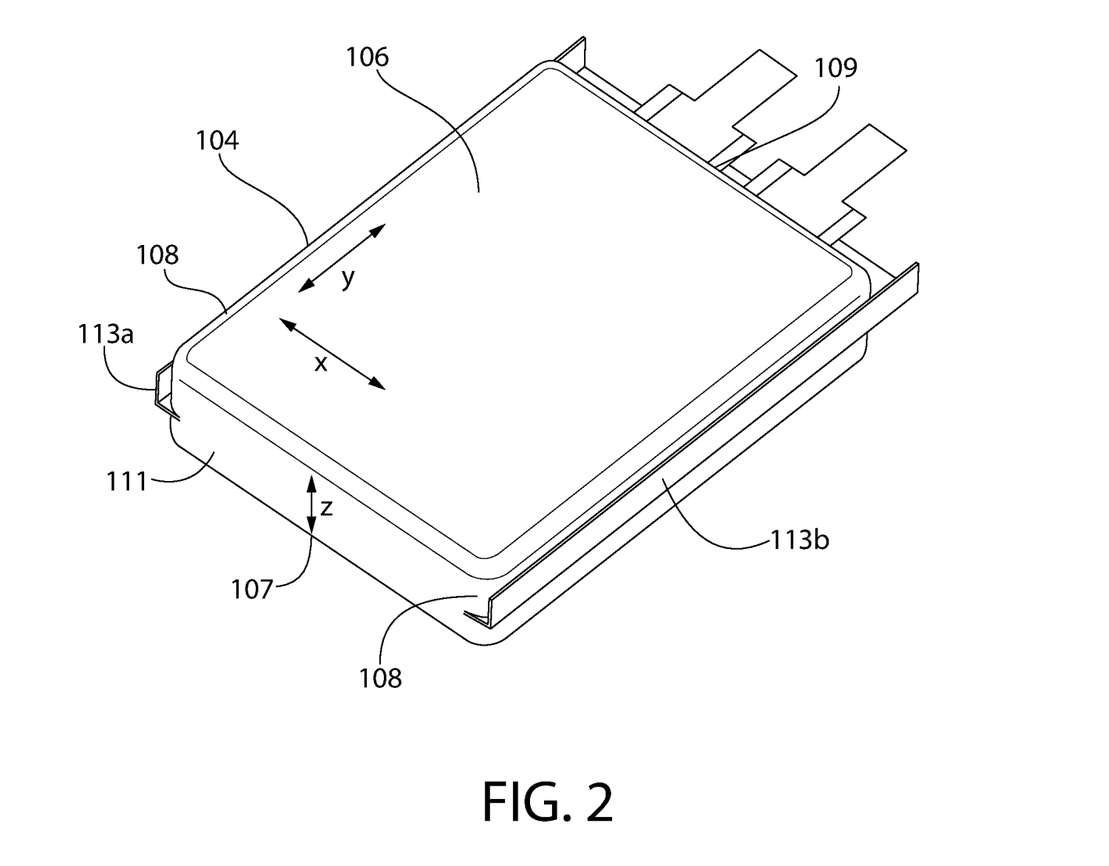
FIG. 2 is a top perspective view of a battery pack in accordance with some implementations of the present invention.

Referring to FIGS. 1 and 2, battery pack 102 may include battery 112 and outer enclosure 104, e.g. cell pouch. Outer enclosure 104 may include top surface 106, bottom surface 107, side walls 108, top seal 109, first side seal 113a, second side seal 113b, and bottom fold 111. In some implementations, outer enclosure 104 is comprised of a flexible material to surround battery 112. For example, outer enclosure 104 may be a bag or pouch and may be sealed around battery 112. During packaging of battery pack 102, battery 112 may be disposed on top of an unfolded outer enclosure 104, which may be unfolded to encompass an area larger than battery 112. Outer enclosure 104 may be folded to cover the entirety of battery 112 and sealed along its edges to create an airtight seal around battery 112. Outer enclosure 104 may be sealed along top seal 109, bottom fold 111, first side seal 113a, and second side seal 113b. Top seal 109, bottom fold 111, first side seal 113a, and second side seal 113b may be formed by the excess material of outer enclosure 104 during sealing around battery 112. In some implementations, first side seal 113a and second side seal 113b extend from side walls 108. However, first side seal 113a and second side seal 113b may extend from top surface 106 or bottom surface 107. First side seal 113a and second side seal 113b may extend from side wall 108 and may be folded to abut side wall 108 to reduce the width and overall size of battery pack 102.

In some implementations, outer enclosure 104 is sealed around battery 112 by heating and melting the excess material of outer enclosure 104 together to form top seal 109, bottom fold 111, first side seal 113a, and second side seal 113b. However, outer enclosure 104 may be sealed around battery 112 by adhesives, welding, magnets, or any other mechanism capable of sealing outer enclosure 104 around battery 112. In some implementations, battery pack 102 may be a non-removable battery, which is encapsulated by an adhesive label wrap and relies on outer enclosure 104 for mechanical protection. In alternative implementations, battery pack 102 may be a removable battery, in which outer enclose 104 includes a hard case to provide protecting to battery 112.

In some implementations, outer enclosure 104 is sealed around battery 112 such that first side seal 113a and second side seal 113b extend from side walls 108. However, outer enclosure 104 may be sealed around battery 112 such that first side seal 113a and second side seal 113b extend from top surface 106 or bottom surface 107. First side seal 113a, and second side seal 113b may extend from sides wall 108 and may be folded upwardly and/or downwardly one or more times to abut side wall 108 to reduce the width and overall size of battery pack 102. First side seal 113a, and second side seal 113b may extend from top surface 106 and bottom surface 107 and may be folded upwardly and/or downwardly one or more times to abut top surface 106 and bottom surface 107, respectively, to reduce the width and overall size of battery pack 102.

In some implementations, battery 112 of battery pack 102 degrades over time resulting in gases being released by battery 112 into battery pack 102. The gases may be sealed within battery pack 102 resulting in outer enclosure 104 swelling and expanding. As battery 112 continues to degrade, more gases are released and the swelling and expansion of outer enclosure 104 increases. In some implementations, outer enclosure 104 expanding results in top surface 106, bottom surface 107, and side walls 108 bulging outward. In traditional methods, continued expansions and swelling of battery 112 may result in rupturing of outer enclosure 104 and/or enclosure 130, and may result damage to areas and/or persons surrounding battery 112.

Referring to FIG. 1, battery pack 102 may be disposed within enclosure 130 and may include interior space 114, which may be the space between battery 112 and outer enclosure 104. Enclosure 130 may be a battery enclosure of an electronic device. In some implementations, enclosure 130 is a casing to provide housing for battery pack 102. For example, battery pack 102 may be disposed within enclosure 130, and enclosure 130 may be configured to be inserted and removed from an electronic device. In some implementations, enclosure 130 is a portion of an electronic device configured to receive battery pack 102. Enclosure 130 may be configured to surround battery pack 102 such that if battery pack 102 begins to swell and expand, battery pack 102 would begin to contact and abut enclosure 130.

In some implementations, when battery 112 degrades and releases gas, the gas may accumulate within interior space 114 resulting in interior space 114 expanding and increasing in size. The expansion of interior space 114 may increase the distance between outer enclosure 104, e.g. cell pouch, and battery 112, e.g. jelly roll structure, resulting in outer enclosure 104 expanding outwards. As battery 112 continues to degrade, more gas is released, and the swelling and expansion of interior space 114 and outer enclosure 104 increases. In some implementations, outer enclosure 104 expanding outwards results in top surface 106, bottom surface 107, and side walls 108 bulging outward due to the accumulation of gas within interior space 114. In some implementations, interior space 114 is sized to allow for some accumulation of gas released by battery 112 without increasing in size. For example, interior space 114 may be configured to allow battery 112 to expand by between approximately 1% to 25%, 5% to 20%, or 10% to 15% prior to interior space 114 increasing in size. In some implementations, interior space 114 is configured to allow battery 112 to expand approximately 12% without interior space 114 increasing in size.

Referring to FIG. 1, battery monitoring system 100 includes pressure sensor 120. Pressure sensor 120 may be disposed within enclosure 130. For example, pressure sensor 120 may be coupled to an interior surface of enclosure 130 such that when outer enclosure 104 of battery pack 102 expands, battery pack 102 contacts pressure sensor 120. Battery monitoring system 100 may include one or more pressure sensors 120. For example, battery monitoring system 100 may include two pressure sensors 120, where an additional pressure sensor acts as a backup to pressure sensor 120, in situations where pressure sensor 120 fails. However, battery monitoring system 100 may include more than two pressure sensors 120. In some implementations, pressure sensor 120 is disposed within battery pack 102. For example, pressure sensor 120 may be disposed within battery pack 102 such that battery pack 102 may be placed into an electronic device and coupled to control board 110. By way of another example, pressure sensor 120 and control board 110 may be disposed within battery pack 102 such that battery monitoring system 100 is completely contained within battery pack 102, which may then be placed into an electronic device.

In a preferred implementation, pressure sensor 120 is disposed on an interior surface of enclosure 130 opposite battery pack 102 such that upon expansion and swelling of battery pack 102, the swollen portion of battery pack 102 contacts pressure sensor 120. Pressure sensor 120 may be disposed within enclosure 130 such that replacement of battery pack 102 does not result in replacing pressure sensor 120. Pressure sensor 120 may be a strain gauge, a potentiometric sensor, a piezoelectric sensor, an inductive sensor, a capacitive sensor, a variable reluctance sensor, or any other type of sensor configured to detect pressure. Pressure sensor 120 may be configured to transmit a pressure reading or indication upon contact or receiving a force applied to it. For example, pressure sensor 120 may be transmit a pressure reading or indication when pressure is applied to pressure sensor 120. The pressure reading or indication may be specific pressure value, an indication regarding a change in pressure, or a detected pressure above a threshold value.

Figure 3A:
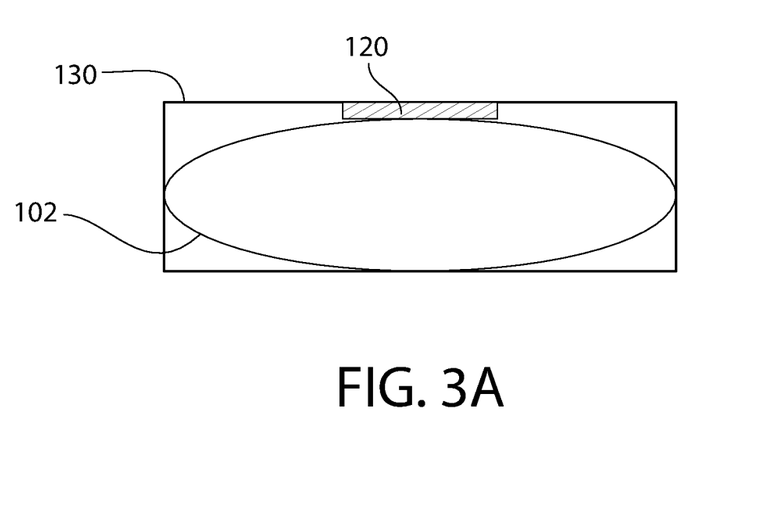
FIGS. 3A and 3B are side views of a swollen battery at various pressures in accordance with some implementations of the present invention.
Figure 3B:
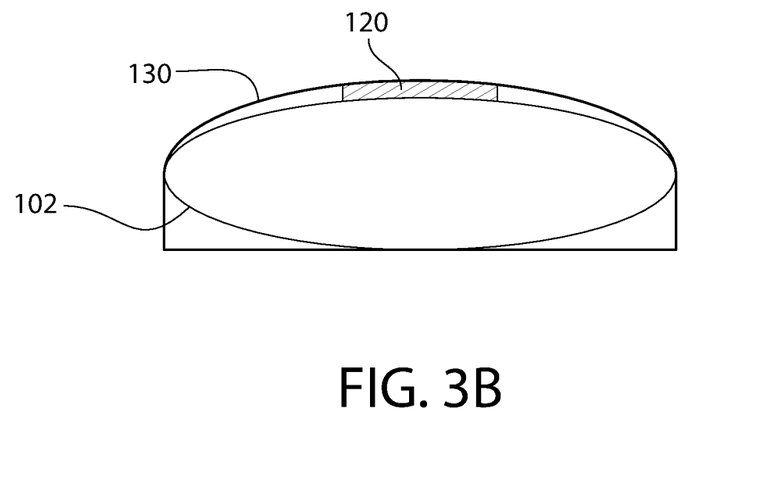

Referring to FIGS. 1 and 3A-3B, pressure sensor 120 may be coupled to control board 110. For example, pressure sensor 120 may be communicatively coupled to control board 110 such that pressure sensor 120 transmits pressure readings to control board 110. In some implementations, control board 110 is disposed within the electronic device, which houses battery pack 102, and communicates with pressure sensor 120 and battery pack 102 via a wired connection. However, control board 110 may communicate with pressure sensor 120 and battery pack 102 via a wireless connection. In some implementations, control board 110 is remote to battery pack 102 and pressure sensor 120 and wirelessly communicates with battery pack 102 and pressure sensor 120. In practice, pressure sensor 120 may be configured to detect when battery pack 120 has swelled and expanded such that battery pack 102 is abutting enclosure 130. Upon detection of pressure from battery pack 102, pressure sensor 120 may transmit a pressure reading or indication to control board 110. In some implementations, control board 110 is configured to transmit an alert or notification to an electronic device of a user to indicate that battery pack 120 has expanded. In some implementations, control board 110 is a battery degradation module.

In some implementations, control board 110, battery 112, and pressure sensor 120 may all be contained within battery pack 102. This configuration allows battery monitoring system 100 to be implemented in a self-contained pack. For example, battery monitoring system 100 may be entirely contained within battery pack 102, which may then be retrofitted into an electronic device.

In some implementations, control board 110 is configured to compare the pressure reading from pressure sensor 120 to one or more pressure threshold values. For example, control board 110 may have stored within a memory of control board 110 a first pressure threshold value and a second pressure threshold value. The first pressure threshold value may be a higher pressure value than second pressure threshold value. In some implementations, the first pressure threshold value is the pressure exerted by battery pack 102 on pressure sensor 120 when battery pack 120 has swelled and expanded to abut pressure sensor 120. The second pressure threshold value may be when the pressure exerted by battery pack 102 on pressure sensor 120 is greater than pressure threshold of enclosure 130, resulting in enclosure 130 expanding or rupturing.

In some implementations, control board 110 is configured to transmit pressure reading requests to pressure sensor 120. Upon receipt of a pressure reading request, pressure sensor 120 may transmit the current pressure exerted on pressure sensor 120 to control board 110. In some implementations, control board 110 may receive multiple pressure readings from pressure sensor 120 over a predetermined period of time. For example, control board 110 may receive pressure sensor readings from pressure sensor 120 over several days to determine the pressure reading and duration of the pressure reading of pressure sensor 120. However, the predetermined period of time may be between one and 24 hours or between 1 and 30 days. This allows control board 110 to determine whether the pressure reading of pressure sensor 120 was due to movement of battery pack 102 instead of expansion of battery pack 102. For example, during use, battery pack 102 may shift to abut pressure sensor 120, thereby resulting in pressure sensor 120 transmitting a pressure reading or indication to control board 110, even though battery pack 112 has not swollen or expanded. By measuring the pressure at pressure sensor 120 over a predetermined period of time, control board 110 can determine whether the pressure exerted at pressure sensor 120 is a prolonged pressure, thereby indicating that battery pack 102 is swollen.

In some implementations, control board 110 is configured to determine that battery pack 102 has ruptured through enclosure 130. For example, control board 110 may monitor the pressure within enclosure 130 via pressure sensor 120. Control board 110 may receive increasing pressure readings over multiple readings and then receive no pressure readings or a pressure reading of 0 PSI, thereby indicating that enclosure 130 has ruptured and/or damaged pressure sensor 120.

In some implementations, battery monitoring system 100 is configured to provide additional measurements to prevent false pressure readings from pressure sensor 120. For example, movement of battery pack 102 within enclosure 130 may result in pressure sensor 120 providing an indication of a pressure, even when battery pack 102 is not swollen or expanded. Therefore, control board 110 may be configured to measure the internal resistance of battery 112 to provide an additional measurement for battery monitoring system 100 to determine whether battery pack 102 has become swollen and expanded.

As is understood in the art, the internal resistance of a battery is the resistance that produces a voltage drop when the battery delivers current. For example, when the battery 112 delivers current, the measured voltage output of battery 112 may be lower than the no-load voltage. The difference, i.e., the voltage drop, is caused by the internal resistance of battery 112.

Figure 4:
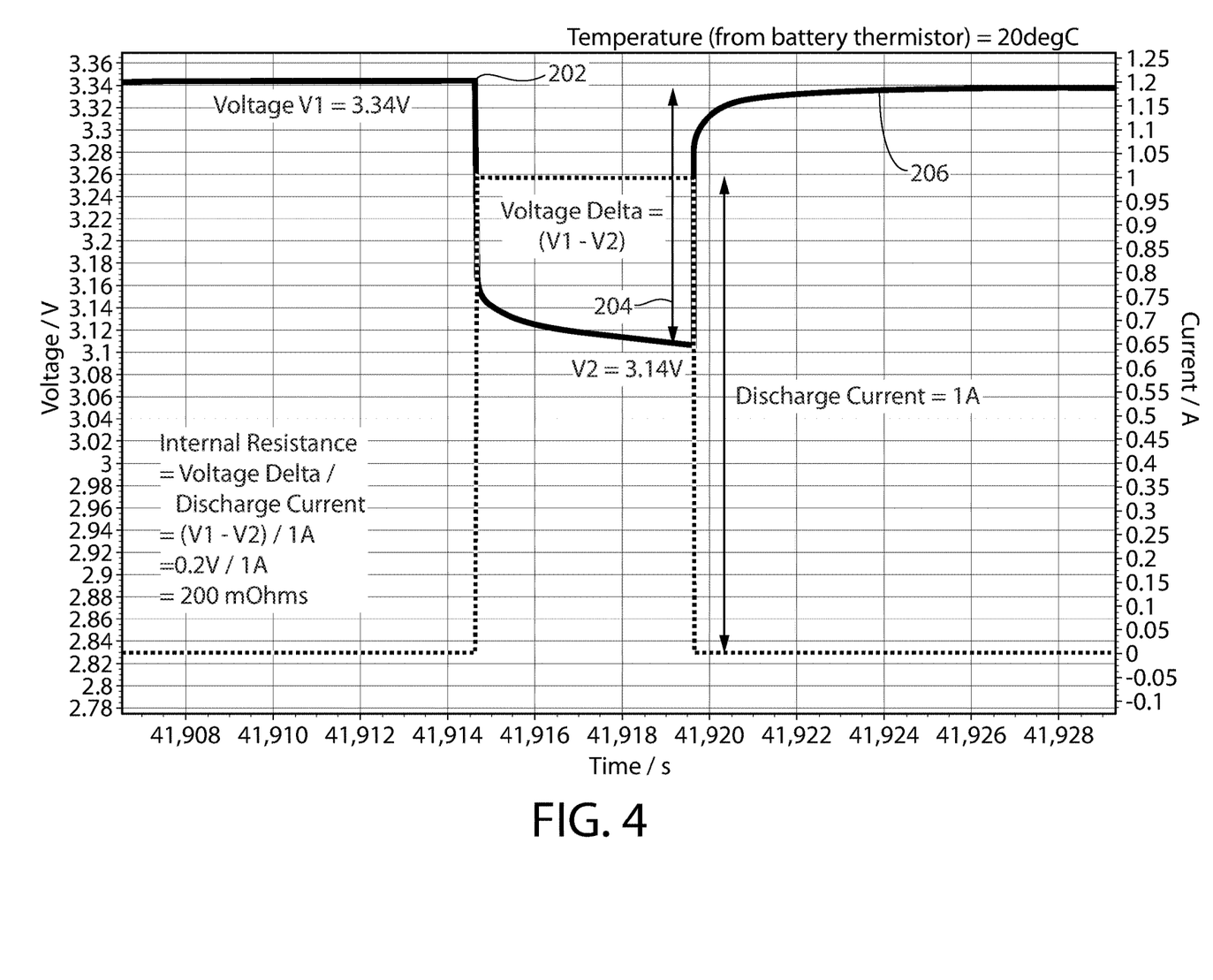
FIG. 4 is a voltage and current graph of battery performance in accordance with some implementations of the present invention.

Referring to FIG. 4, the internal resistance value of battery 112 may be determined by delivering a discharge pulse to battery 112 and measuring the voltage before the discharge pulse and before the discharge pulse release. For example, the internal resistance value of battery 112 may be determined by measuring the voltage of battery 112 prior to a discharge pulse, as shown at point 202. The discharge pulse may be a pulse of current of 1 A. At point 204, after the discharge pulse has been delivered, the voltage of battery 112 may decrease due to the natural internal resistance of battery 112. The voltage difference between points 202 and 204 may be the voltage drop of battery 112 that occurs due to the internal resistance of battery 112. The internal resistance value may be determined by dividing the voltage drop by the current of the discharge pulse. In some implementations, the voltage at point 206 is lower than the voltage at point 202 due to battery 112 having a lower capacity due to the capacity of battery 112 being consumed during the discharge pulse. For example, during the discharge pulse, the capacity of battery 112 is lowered due to the voltage drop.

Figure 5:
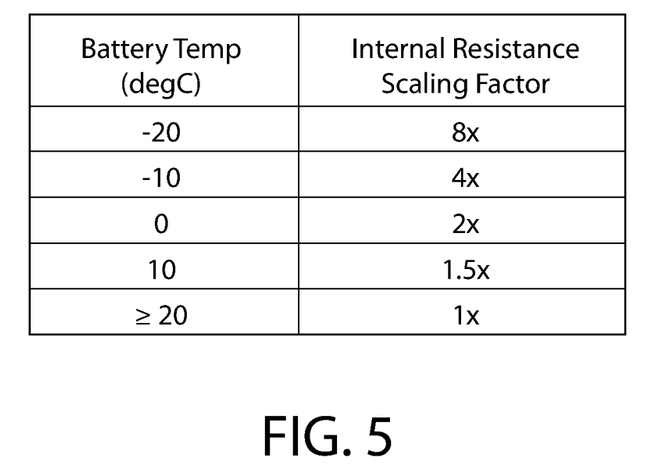
FIG. 5 is a table indicating the scaling of the internal resistance based on temperature in accordance with some implementations of the present invention.

Referring to FIG. 5, the temperature of battery 112 may affect the internal resistance of battery 112. For example, the internal resistance value measured at battery 112 may be greater in colder weather. Battery pack 102 may include a thermistor, which is configured to detect the temperature of battery 112. In cold temperature weather, the internal resistance of battery 112 may be reduced compared to normal temperatures. Control board 110 may be configured to scale the internal resistance value of battery 112 based on temperatures of battery 112 measured by the thermistor. For example, control board 110 may be configured to scale the first internal resistance value and the second internal resistance value based on a temperature of battery pack 102 detected by control board 110. In some implementations, cold temperatures, such as −20 degrees Celsius, result in the internal resistance value of battery 112 being increased by approximately 8 times.

In practice, control board 110 may transmit a discharge pulse to battery 112 and measure the voltage drop and the current of the discharge pulse to determine the internal resistance value of battery 112. As battery 112 begins to degrade and gas begins to accumulate within interior space 114 causing battery pack 102 to expand, the internal resistance of battery 112 begins to increase. For example, as battery 112 begins to degrade and battery pack 102 swells and expand, the voltage drop between points 202 and 204 increases resulting in an increase in the internal resistance. The increase in the internal resistance may be measured by control board 110, indicating that battery 112 is degrading and battery pack 102 is swelling. In some implementations, control board 110 is configured to transmit an alert or notification to an electronic device of a user when the internal resistance value of battery 112 is above a predetermined internal resistance threshold value.

Figure 6A:
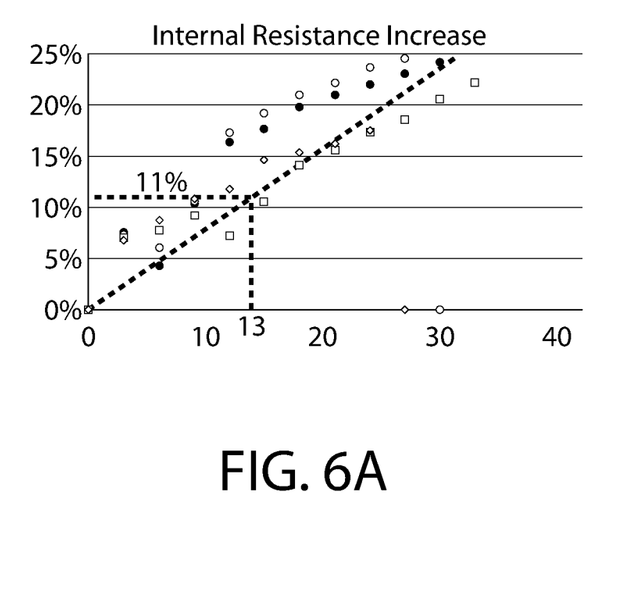
FIG. 6A is a comparison of internal resistance of a battery over time of the battery in accordance with some implementations of the present invention.
Figure 6B:
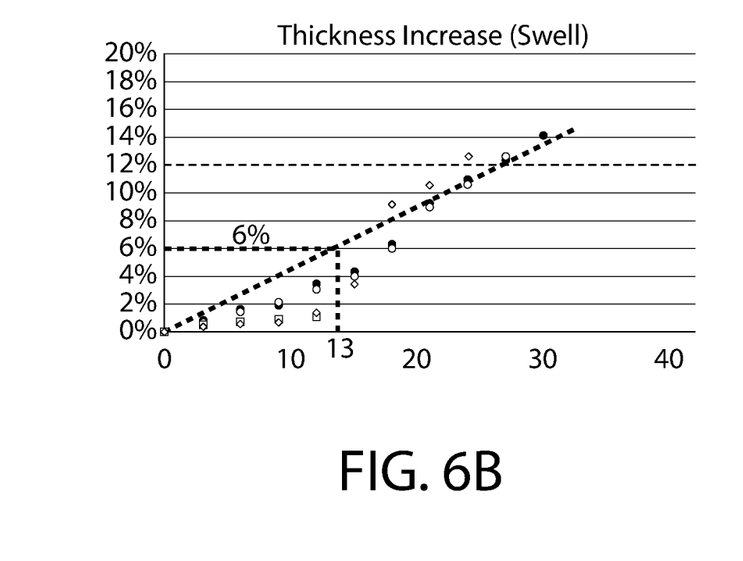
FIG. 6B is a comparison of the thickness increase (swelling) of the battery over time in accordance with some implementations of the present invention.

Referring to FIGS. 6A and 6B, the increase in the internal resistance value may indicate an increase in the swelling of battery 112. A substantially linear increase in the increase of the internal resistance value may correlate in a substantially linear increase in the swelling of a battery. For example, at 13 days, the resistance increase is approximately 11% (FIG. 6A), and the thickness increase is approximately 6% (FIG. 6B). In some implementations, control board 110 is configured to receive an indication from pressure sensor 120 that battery pack 102 is expanding and may confirm this indication by determining whether the internal resistance value has increased. For example, control board 110 may determine an initial baseline value for the internal resistance of battery 112 and may compare that with any future readings to determine if battery pack 102 has begun to expand and swell. In some implementations, control board 110 is configured to periodically measure the internal resistance value of battery 112 to determine if there are deviations from the baseline.

In some implementations, control board 110 is configured to compare the first internal resistance value to the initial resistance value to determine a first internal resistance increase value. The first internal resistance increase value may be the difference in internal resistance values between the first internal resistance value and the initial internal resistance value. Control board 110 may calculate a first swell increase value associated with battery pack 102 based on the first internal resistance increase value. For example, control board 110 may have stored within a memory associated with control board 110 a relationship between an increase in the internal resistance value of battery 112 and the swelling of battery 112 associated with the increase in the internal resistance value. In some implementations, control board 110 is configured to compare a second internal resistance value to the first resistance value to determine a second internal resistance increase value. The second internal resistance increase value may be the difference in internal resistance values between the second internal resistance value and the first internal resistance value. Control board 110 may calculate a second swell increase value associated with battery pack 102 based on the second internal resistance increase value.

In some implementations, control board 110 is configured to measure the internal resistance value of battery 112 as predetermined intervals. For example, control board 110 may measure the internal resistance value of battery 112 approximately every hour, every 2 hours, every 4 hours, every 6 hours, every 8 hours, every 10 hours, every 12 hours, every 15 hours, every 18 hours, every 24 hours, every 48 hours, or every 72 hours. Control board 110 may measure the internal resistance value of battery 112 one a week, once every two weeks, once every three weeks, once every four weeks, once a month, once every two months, once every three months, once every four months, once every six months, or once a year. However, control board 110 may measure the internal resistance value of battery 112 whenever control board 110 receives a pressure indication from pressure sensor 120 that battery pack 102 is exerting a pressure on pressure sensor 120. For example, control board 110 may measure the internal resistance value of battery 112 when the pressure reading from pressure sensor 120 exceeds a predetermined pressure threshold value.

Figure 7:
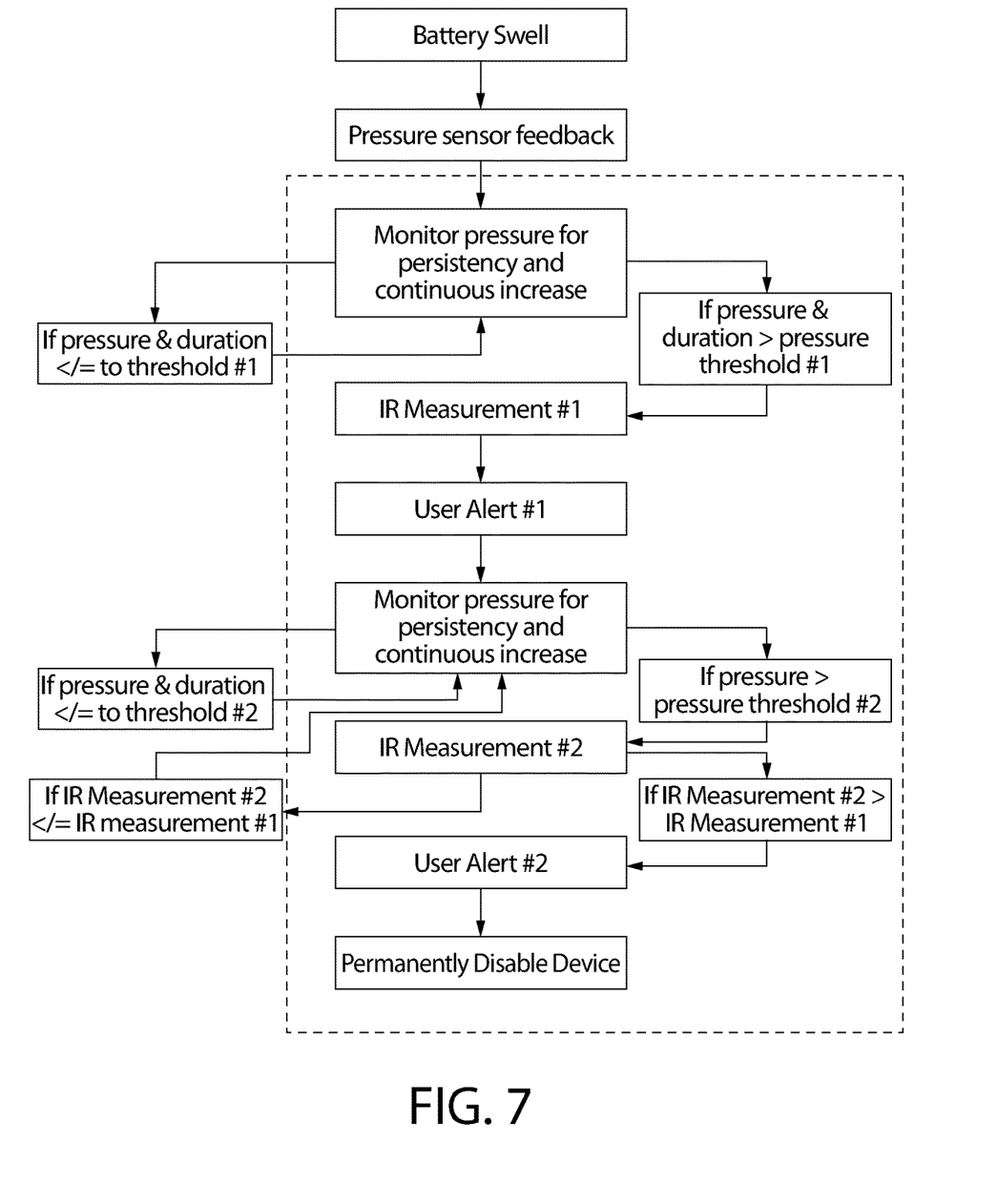
FIG. 7 is an exemplary flowchart of a method performed by the battery monitoring system of FIG. 1.

Referring to FIG. 7, a method of detecting battery degradation is shown. In some implementations, pressure sensor 120 is configured to provide feedback to control board 110 regarding the pressure exerted on pressure sensor 120 by battery pack 102. When pressure sensor 120 detects a pressure exerted by battery pack 102 over a predetermined pressure threshold value for a specific duration, control board 110 may then measure the internal resistance value of battery 112. In some implementations, control board 110 is configured to have one or more pressure threshold values. For example, control board 110 may have a first pressure threshold value and second pressure threshold value. The second pressure threshold value may be a greater pressure value than the first pressure threshold value. For example, the first pressure threshold value may be approximately 45 PSI and the second pressure threshold value may be approximately 90 PSI. In some implementations, the first pressure threshold value is when battery pack 102 abuts pressure sensor 120 and the second pressure threshold value may be when battery pack 102 causes deformation of pressure sensor 120 and/or enclosure 130.

In some implementations, battery 112 has a maximum pressure threshold, which may be the mechanical breaking point of battery 112. The second pressure threshold value may be at or just below the maximum pressure threshold of battery 112. For example, the maximum pressure threshold of battery 112 may be approximately 28 PSI resulting in the second pressure threshold value being 28 PSI. However, the maximum pressure threshold for battery 112 may be between approximately 0 PSI and 50 PSI, approximately 10 PSI and 40 PSI, or approximately 20 PSI and 30 PSI. In some implementations, the maximum pressure threshold of battery 112 is provided by a manufacturer.

Control board 110 may receive a pressure reading from pressure sensor 120 and compare the pressure reading to a first pressure threshold value to determine if the pressure reading from pressure sensor 120 is above a first pressure threshold value. If the pressure reading from pressure sensor 120 is above the first pressure threshold value, then control board 110 may measure the internal resistance value of battery 112 to determine a first internal resistance value of battery 112. In some implementations, control board 110 measures the internal resistance value of battery 112 by applying a discharge pulse to battery 112. Control board 110 may calculate a first internal resistance value of battery 112 in response to the discharge pulse to battery 112. Control board 110 may compare the first internal resistance value of battery 112 to a previously determined baseline internal resistance value. The previously determined baseline internal resistance value may be an internal resistance value determined by control board 110 when battery 112 was initially used. In some implementations, the previously determined baseline internal resistance value is an internal resistance value of battery 112 based on initial testing or standard values of battery 112 in initial conditions, such when used battery 112 is used for the first time. In some implementations, control board 110 is configured to determine the internal resistance value of battery 112 and store the value in a memory associated with control board 110. In some implementations, control board 110 is configured to store the first internal resistance value and the second internal resistance value within the memory. Control board 110 may transmit an alert or notification to an electronic device of a user if the pressure reading of pressure sensor 120 is greater than the first pressure threshold value and/or if the internal resistance value of battery 112 is greater than the previously determined baseline internal resistance value of battery 112.

In some implementations, control board 110 is configured to continue to monitor the pressure exerted by battery pack 102 on pressure sensor 120. Pressure sensor 120 may detect that battery pack 102 is exerting a pressure on pressure sensor 120 and may transmit a second pressure reading to control board 110. Control board 110 may receive the second pressure reading from pressure sensor 120 and compare the second pressure reading to a second pressure threshold value. If the second pressure reading is greater than the second pressure threshold value, control board 110 may apply a second battery discharge pulse to battery pack 102. In response to the second battery discharge pulse, control board 110 may measure the internal resistance value of battery 112 to determine a second internal resistance value of battery 112. Control board 110 may compare the first internal resistance value of battery 112 to the second internal resistance value. Control board 110 may transmit an alert or notification to an electronic device of a user if the pressure reading of pressure sensor 120 is greater than the second pressure threshold value and/or if the second internal resistance value of battery 112 is greater than the first internal resistance value of battery 112. In some implementations, control board 110 is configured to disable or shut-off the electronic device that battery pack 102 is disposed in when a threshold value is exceeded. For example, control board 110 may disable any communication between battery 112 and/or battery pack 102, and the electronic device thereby preventing battery 112 from receiving or discharging any power to the electronic device. In some implementations, control board 110 is configured to permanently disable the electronic device to prevent any additional degradation of battery 112.

In some implementations, control board 110 is configured to determine that the internal resistance value of battery 112 is above a predetermined internal resistance value and, in response, may disable the electronic device that houses battery pack 102. For example, control board 110 may measure the internal resistance value of battery 112 and disable the electronic device if the measured internal resistance value is greater than a predetermined internal resistance value. In some implementations, control board 110 compares the second internal resistance value to a threshold internal resistance value. Control board 110 may disable the electronic device associated with the battery pack if the second internal resistance value exceeds the threshold internal resistance value.

In some implementations, control board 110 is configured to determine that the pressure value of battery pack 102 is above to a third pressure threshold value and, in response, may disable the electronic device that houses battery pack 102. The third pressure threshold value may be a percentage of the maximum pressure threshold of battery pack 102, which may be the pressure value prior to the first side seal 113a and second side seal 113b rupturing. For example, the maximum pressure threshold for battery pack 102 may be approximately 145 PSI and control board 110 may determine that the pressure value of battery pack 102 is 75% of the maximum pressure threshold value, and thus may disable the electronic device housing battery pack 102. However, the maximum pressure threshold of battery pack 102 may be between approximately 50 PSI and 300 PSI, approximately 100 PSI and 250 PSI, or approximately 150 PSI and 200 PSI. In some implementations, the third pressure threshold value is between 25% and 99%, 30% and 80%, or 50% and 75% of the maximum pressure threshold of battery pack 102. In some implementations, the maximum pressure threshold of battery 112 is provided by a manufacturer.

In some implementations, control board 110 is configured to store in memory the pressure values and internal resistance value of battery 112 prior to disabling of the electronic device. The stored pressure values and internal resistance values may be used for future research and development to determine the pressure threshold values and internal resistance threshold values that may be utilized to prevent rupture and over-swelling of a battery.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method for monitoring battery degradation, the method comprising:
receiving, from a pressure sensor, multiple pressure readings over a predetermined period of time, the pressure readings associated with a battery pack, the pressure sensor being communicatively coupled to a control board and disposed such that, upon expansion of the battery pack, a portion of the battery pack comes into contact with the pressure sensor;
responsive to the pressure readings over the predetermined period of time exceeding a pressure threshold value, applying a first battery discharge pulse to the battery pack;
calculating, by the control board, a first internal resistance value of the battery pack in response to the first battery discharge pulse;
comparing, by the control board, the first internal resistance value to a reference resistance value; and
responsive to the first internal resistance value exceeding the reference resistance value, transmitting an alert to an electronic device.

2. The method of claim 1, further comprising:
receiving, from the pressure sensor, a second pressure reading associated with the battery pack;
responsive to the second pressure reading exceeding a second pressure threshold value, applying a second battery discharge pulse to the battery pack;
calculating a second internal resistance value of the battery pack in response to the second battery discharge pulse;
comparing the second internal resistance value to the first internal resistance value; and
if the second internal resistance value exceeds the first internal resistance value, transmitting a function request to the battery pack.

3. The method of claim 2, further comprising:
comparing the second internal resistance value to a threshold internal resistance value and disabling an electronic device associated with the battery pack if the second internal resistance value exceeds the threshold internal resistance value.

4. The method of claim 2, further comprising:
transmitting an alert if the second internal resistance value exceeds the first internal resistance value.

5. The method of claim 2, wherein the function request includes a disable request.

6. The method of claim 2, further comprising:
storing the multiple pressure readings over the predetermined period of time, the second pressure value, the first internal resistance value, and the second internal resistance value within a memory.

7. The method of claim 2, further comprising:
scaling the first internal resistance value and the second internal resistance value based on a temperature detected by the battery pack.

8. The method of claim 2, further comprising:
comparing, by the control board, the first internal resistance value to the reference resistance value to determine a first internal resistance increase value; and
determining, by the control board, a first swell increase value associated with the battery pack based on the first internal resistance increase value.

9. The method of claim 8, further comprising:
comparing the second internal resistance value to the first internal resistance value to determine a second internal resistance increase value; and
determining a second swell increase value associated with the battery pack based on the second internal resistance increase value.

10. The method of claim 1, wherein the pressure sensor is disposed proximate the battery pack.

11. The method of claim 1, wherein the battery pack is configured to be disposed within an enclosure.

12. The method of claim 1, wherein the control board is configured to communicate with the pressure sensor via a wireless connection.

13. The method of claim 1, wherein the multiple pressure readings over the predetermined period of time are generated in response to a pressure reading request from the control board.

14. A method for monitoring battery degradation, the method comprising:
receiving, from a pressure sensor, multiple pressure readings over a redetermined period of time, the pressure readings associated with a battery pack, wherein:
the pressure sensor is communicatively coupled to a control board and disposed such that, upon expansion of the battery pack, a portion of the battery pack comes into contact with the pressure sensor; and
the battery pack is disposed within an enclosure of an electronic device;
responsive to the pressure readings over the predetermined period of time exceeding a first pressure threshold value, applying a first battery discharge pulse to the battery pack to determine a first discharge voltage;
calculating, by the control board, a first internal resistance value of the battery pack in response to the first battery discharge pulse based on a comparison of the first discharge voltage and a baseline voltage;
determining, by the control board, if the first internal resistance value exceeds an initial internal resistance value, wherein the initial internal resistance value is associated with an initial state of the battery pack;
associating, by the control board, the first internal resistance value with a swell increase of the battery pack; and
responsive to the first internal resistance value exceeding the initial internal resistance value, transmitting an alert to a device associated with a user, wherein the alert includes an indication associated with the swell increase of the battery pack.

15. The method of claim 14, a further comprising:
receiving, from the pressure sensor, a second pressure reading associated with the battery pack;
responsive to the second pressure reading exceeding a second pressure threshold value, applying a second battery discharge pulse to the battery pack to determine a second discharge voltage;
calculating, by the control board, a second internal resistance value of the battery pack in response to the second battery discharge pulse based on a comparison of the second discharge voltage and the first discharge voltage;
determining, by the control board, if the second internal resistance value exceeds the first internal resistance value; and
responsive to the second internal resistance value exceeding the first internal resistance value, transmitting a disable request to the battery pack.

16. An electronic device comprising:
a battery pack;
a pressure sensor disposed proximate to the battery pack; and a battery degradation module communicatively coupled to the battery pack and the pressure sensor, the battery degradation module configured to:
  receive, from the pressure sensor, multiple pressure readings over a predetermined period of time, the pressure readings associated with the battery;
  responsive to the pressure readings over the predetermined period of time exceeding a first pressure threshold value, apply a first battery discharge pulse to the battery pack;
  calculate a first internal resistance value of the battery in response to the first battery discharge pulse;
  determine if the first internal resistance value exceeds an initial internal resistance value; and
  responsive to the first internal resistance value exceeding the initial internal resistance value, transmit an alert to an electronic device.

17. The electronic device of claim 16, wherein the battery degradation module is further configured to:
  receive, from the pressure sensor, a second pressure reading associated with the battery pack;
  responsive to the second pressure reading exceeding a second pressure threshold value, apply a second battery discharge pulse to the battery pack;
  calculate a second internal resistance value of the battery pack in response to the second battery discharge pulse;
  determine if the second internal resistance value exceeds the first internal resistance value; and
  responsive to the second internal resistance value exceeding the first internal resistance value, transmit a function request to the battery pack.

18. The electronic device of claim 17, wherein the battery degradation module is further configured to:
  scale the first internal resistance value and the second internal resistance value based on a temperature detected by the battery pack.

19. The electronic device of claim 17, wherein the function request includes a disable request.

20. The electronic device of claim 16, wherein the battery degradation module is further configured to:
  responsive to the multiple pressure readings over the predetermined period of time exceeding a third pressure threshold value;
  transmit a disable request to the battery pack.

* * * * *